United States Patent
Miura

Patent Number: 6,052,317
Date of Patent: Apr. 18, 2000

[54] OUTPUT CIRCUIT OF SEMICONDUCTOR MEMORY DEVICE

[75] Inventor: Naoki Miura, Tokyo, Japan

[73] Assignee: Oki Electric Industry Co., Ltd., Tokyo, Japan

[21] Appl. No.: 09/140,329

[22] Filed: Aug. 26, 1998

[30] Foreign Application Priority Data

Sep. 24, 1997 [JP] Japan .................................. 9-258196

[51] Int. Cl.[7] .................................................. G11C 7/00
[52] U.S. Cl. ................................ 365/189.11; 365/189.05
[58] Field of Search .......................... 365/189.11, 189.05, 365/189.07, 189.01

[56] References Cited

U.S. PATENT DOCUMENTS

| | | | |
|---|---|---|---|
| 5,260,901 | 11/1993 | Nagase et al. | 365/189.07 |
| 5,331,593 | 7/1994 | Merritt et al. | 365/189.11 |
| 5,701,090 | 12/1997 | Hidaka et al. | 326/32 |

FOREIGN PATENT DOCUMENTS 7-102468  7/1995  Japan .

*Primary Examiner*—Tan T. Nguyen
*Attorney, Agent, or Firm*—Jones Volentine, LLP

[57] ABSTRACT

An output circuit of a semiconductor memory device is made up of a level recognition circuit which outputs a feedback signal by comparing an output node and a second reference voltage, and a P-channel MOS transistor and an N-channel MOS transistor which complimentary turn on and off in response to the feedback signal. As a result, when a charge of the output node is not sufficient, the output node is charged by setting a voltage of a power supply node to a power supply voltage Vcc. Then, when the output node is sufficiently charged, the N-channel MOS transistor turns on, and as a result the voltage of the power supply node is set to a first reference voltage. Accordingly, the output circuit of the semiconductor memory device achieve an increased operation speed and decreased voltage level amplitude at the output node.

6 Claims, 3 Drawing Sheets

6,052,317

OUTPUT CIRCUIT OF SEMICONDUCTOR MEMORY DEVICE

BACKGROUND OF THE INVENTION

1. Field of the Invention

The present invention generally relates to an output circuit of a semiconductor memory device, and more particularly, the present invention relates to a circuit for setting to an output node voltage corresponding to a data output node from a memory cell.

This application is a counterpart of Japanese application Ser. No. 258196/1997, filed Sep. 24, 1997, the subject matter of which is incorporated herein by reference.

2. Description of the Related Art

A conventional related art is generally disclosed in Japanese Patent Laid Open No.7-192468. A conventional output circuit is made up of a transistor for transferring a voltage of a power supply voltage node to an output node, a comparator which is activated in response to a timing clock signal and which compares a voltage of the power supply voltage node and a reference voltage, and another transistor which is connected between the power supply voltage node and a power supply voltage and which forms a current path between the power supply voltage node and the power supply voltage by turning on in response to an output signal of the comparator.

In the conventional output circuit, at first, the power supply voltage node is set to a ground potential. The current path is formed between the power supply voltage node and the power supply voltage in response to a compared result of the comparator after a timing of the clock signal. The voltage of the power supply voltage node is rises as a result of the charge. As a result, a voltage rise rate of the power supply voltage node is slow.

In the conventional output circuit, it is desirable to increase an operation speed.

SUMMARY OF THE INVENTION

An object of the present invention is to provide an output circuit of a semiconductor memory device that can increase an operation speed and decrease amplitude of the voltage level in the output node.

According to one aspect of the present invention, for achieving the above object, there is provided an output circuit comprising a memory cell which stores a data; an amplifier which generates a voltage signal by amplifying the data read out from the memory cell; an output node which is connected between a first power supply voltage and a second power supply voltage; a first switching device which is connected between a first node and the first power supply voltage and which turns on and off in response to a feedback signal; a second switching device which is connected between a first reference voltage and the first node, and which complimentary turns on and off relative to the first switching device in response to the feedback signal; a charge discharge circuit, responsive to the voltage signal, which performs a charge discharge operation of the output node by connecting the first node and the output node and by connecting the second power supply voltage and the output node; and a level recognition circuit which outputs the feedback signal to turn on the first switching device when a voltage of the output node is less than a second reference voltage and which outputs the feedback signal to turn on the second switching device when the voltage of the output node is more than the second reference voltage.

According to another aspect of the present invention, for achieving the above object, there is provided an output circuit comprising a memory cell which stores a data; an amplifier which generates a voltage signal by amplifying the data read out from the memory cell; an output node which is connected between a first power supply voltage and a second power supply voltage; a charge discharge circuit, responsive to the voltage signal, which performs a charge discharge operation of the output node by connecting the first power supply voltage and the output node and by connecting the second power supply voltage and the output node; a subsidiary circuit which is connected between the first power supply voltage and the output node and which performs the charge or discharge operation of the output node in combination with the charge discharge circuit when turning on in response to the voltage signal; a level recognition circuit which outputs a control signal when a voltage of the output node is more than the reference voltage; and a cut off circuit which turns off the subsidiary circuit by cutting off the voltage signal before applying the voltage signal to the subsidiary circuit when the control signal is valid.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A semiconductor memory device according to a first preferred embodiment of a present invention will hereinafter be described in detail with reference to FIG. 1.

Figure 1:
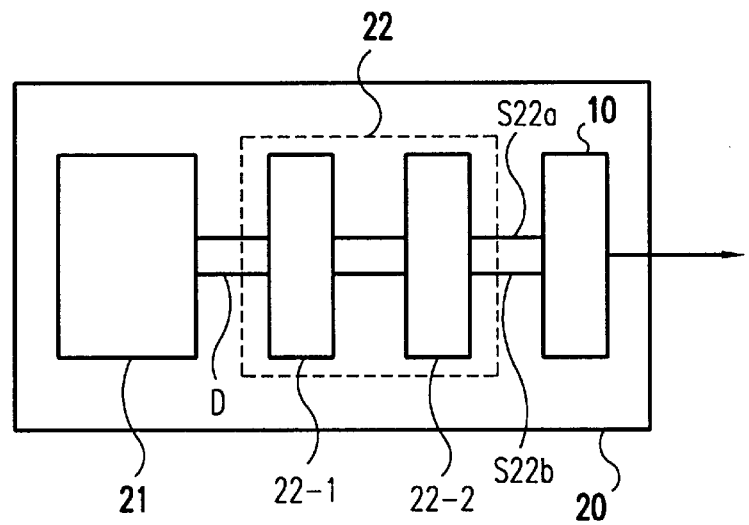
FIG. 1 is a diagram showing a semiconductor memory device according to a first preferred embodiment of a present invention.

FIG. 1 is a diagram showing a semiconductor memory device according to a first preferred embodiment of a present invention.

As shown in FIG. 1, a semiconductor memory device 20 is preferably made up of a memory cell array 21, an amplifier 22 which generates voltage signals S22a and S22b by amplifying data D which is read out from a memory in the memory cell array 21, and an output circuit 10 which is located in an output side of the semiconductor memory device 20, for example an SDRAM (Synchronous Dynamic Random Access Memory) or EDODRAM (Extended Data Out Dynamic Random Access Memory). The amplifier 22 includes a sense amplifier 22-1 which is connected to the memory cell array 21 and a read amplifier 22-2 which is connected to the output circuit 10.

Figure 2:
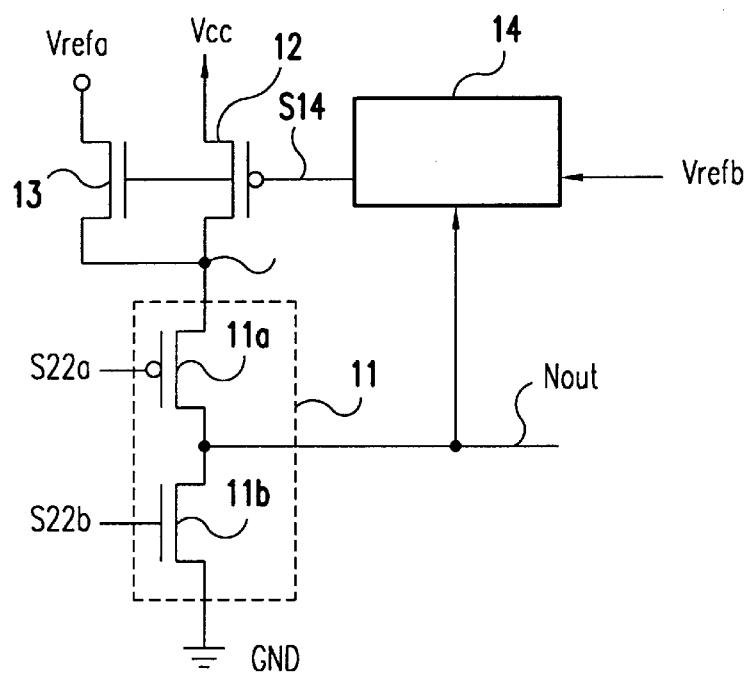
FIG. 2 is a diagram showing an output circuit of a semiconductor memory device according to the first preferred embodiment of the present invention.

FIG. 2 is a diagram showing an output circuit of a semiconductor memory device according to the first preferred embodiment of the present invention.

As shown in FIG. 2, the output circuit 10 includes an output node Nout for outputting a voltage to an external unit and a charge-discharge circuit 11 for performing a charge-discharge of the output node Nout. The charge-discharge circuit 11 is preferably made up of a P-channel MOS transistor 11a and an N-channel MOS transistor 11b. The P-channel MOS transistor 11a has a drain which is connected to the output node Nout, a source which is connected to a power supply node N1 as a first node, and a gate to which a voltage signal S22a is inputted. The N-channel MOS transistor 11b has a drain which is connected to the output node Nout, a source which is connected to a ground GND as a second power supply voltage, and a gate to which a voltage signal S22b is inputted. The output circuit 10 further includes a P-channel MOS transistor 12 as a first switching device, an N-channel MOS transistor 13 as a second switching device, and a level recognition circuit 14. The P-channel MOS transistor 12 has a drain which is connected to a Vcc (3.3V) as a first power supply voltage, and a source which is connected to the power supply node N1. The N-channel MOS transistor 13 has a drain which is connected to a first reference voltage Vrefa of 2.4V, and which has a source which is connected to the power supply node N1. Here, the first reference voltage Vrefa has a voltage level midway between the first and second power supply voltages. The level recognition circuit 14 is connected to the output node Nout and which is inputted a second reference voltage Vrefb. The level recognition circuit 14 compares the voltage of the output node Nout with the second reference voltage Vrefb, and applies a feedback signal S14 as the compared result to the P-channel MOS transistor 12 and the N-channel MOS transistor 13.

Figure 3:
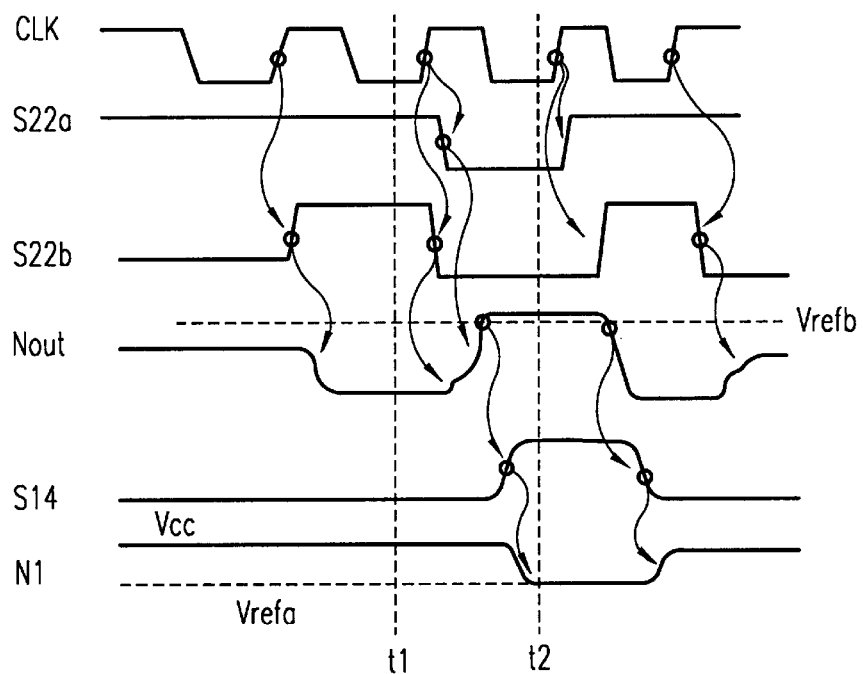
FIG. 3 is a timing chart showing an operation of the output circuit of the semiconductor memory device according to the first preferred embodiment of the present invention.

FIG. 3 is a timing chart showing an operation of the output circuit of the semiconductor memory device according to the first preferred embodiment of the present invention.

At an initial state, the voltage signal S22a is an H level, the voltage signal S22b is an L level, and the feedback signal S14 is an L level. At this time, the P-channel MOS transistor 11a and the N-channel MOS transistor 11b are turned off, the P-channel MOS transistor 12 is turned on, and the voltage of the power supply node N1 is the power supply voltage Vcc. A clock signal of the semiconductor memory device for designating an output timing rises, and as a result a voltage of the voltage signal S22a or the voltage signal S22b changes in response to the data read out from the memory cell. For example, when the data read out from the memory cell is "0", the voltage signal S22b changes from an L level to an H level, and as a result the N-channel MOS transistor 11b turns on. Accordingly, the output node Nout becomes the ground GND level (shown in time t1 of FIG. 3). Data "1" is read out from the memory cell synchronizing with a rising of a next clock signal CLK, and as a result the N-channel MOS transistor 11b is turned off by the rising of the voltage signal S22b, and then the P-channel MOS transistor 11a is turned on by the falling of the voltage signal S22a. At this time, a charging of the output node Nout starts. The level recognition circuit 14 compares a voltage of the output node Nout and the second reference voltage Vrefb (for example 2.4V). In the compared result, when the voltage of the output node Nout is lower than the second reference voltage Vrefb, the level recognition circuit 14 outputs the feedback signal S14 of an L level. When the voltage of the output node Nout is more than the second reference voltage Vrefb, the level recognition circuit 14 outputs the feedback signal S14 of an H level. The feedback signal S14 is an L level while the voltage of the output node Nout is lower than the second reference voltage Vrefb, and as a result the P-channel MOS transistor 12 and the N-channel MOS transistor 13 turn off, and the power supply node N11 is the power supply voltage (for example 3.3V). A charge of the output node Nout proceeds, the voltage of the output node Nout becomes more than the second reference voltage Vrefb, and as a result the feedback signal S14 changes to an H level, the P-channel MOS transistor 12 turns off, and the N-channel MOS transistor 13 turns on. The voltage of the power supply node N1 changes to the first reference voltage Vrefa as a result of the N-channel MOS transistor 13 turning on. Therefore, the voltage of the output node Nout charges until the voltage of the power supply node N1 becomes a level of the first reference voltage Vrefa (shown in time t2 of FIG. 3). The operations as described above are repeated, and a voltage corresponding to a logic level of the data D is outputted from the output node Nout.

As mentioned above, the output circuit of the first preferred embodiment is made up of the level recognition circuit 14 which outputs the feedback signal S14 by comparing the output node Nout and the second reference voltage Vrefb, and the P-channel MOS transistor 12 and the N-channel MOS transistor 13 complimentary turn on and off in response to the feedback signal S14. As a result, when the charge of the output node Nout is not sufficient, the output node Nout is charged by setting the voltage of the power supply node N1 to the power supply voltage Vcc. Then, when the output node Nout is sufficiently charged, the N-channel MOS transistor 13 turns on, and as a result the voltage of the power supply node N1 is set to the first reference voltage Vrefa. Accordingly, the output circuit of the first preferred embodiment can cause the output node Nout to rise at high speed. Further, the output circuit of the first preferred embodiment can decrease the amplitude of the voltage level in the output node Nout.

A semiconductor memory device according to a second preferred embodiment of the present invention will hereinafter be described in detail with reference to FIG. 4.

Figure 4:
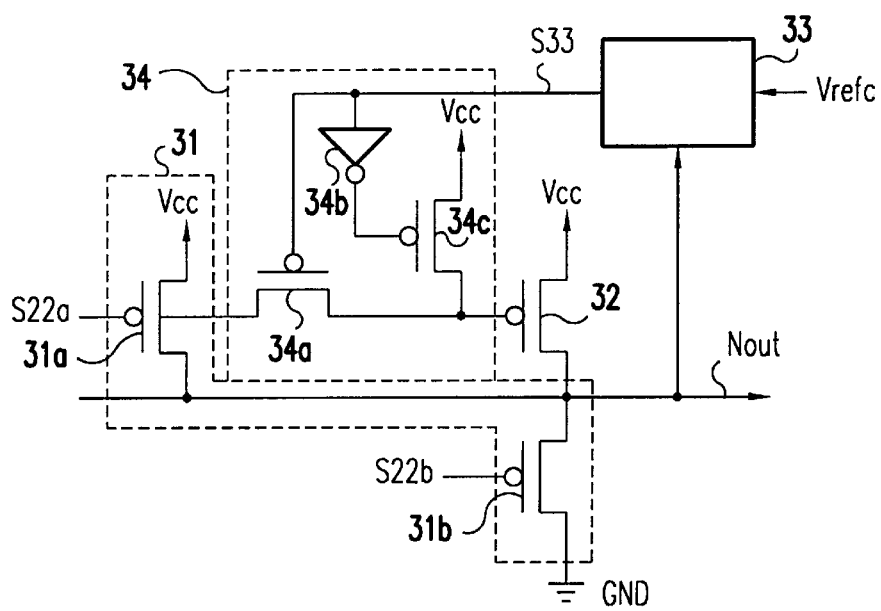
FIG. 4 is a diagram showing a semiconductor memory device according to a second preferred embodiment of the present invention.

FIG. 4 is a diagram showing a semiconductor memory device according to a second preferred embodiment of the present invention.

As shown in FIG. 4, an output circuit includes an output node Nout for outputting a voltage to an external unit, and a charge discharge circuit 31 for performing a charge discharge operation of the output node Nout. The charge discharge circuit 31 is preferably made up of a PMOS 31a and an NMOS 31b. The PMOS 31a has a drain connected to the output node Nout, a source connected to a first power supply voltage Vcc, and a gate inputted with a voltage signal S22a. The NMOS 31b has a drain connected to the output node Nout, a source connected to a ground GND as a second power supply voltage, and a gate inputted with a voltage signal S22b. The output circuit 10 further includes a P-channel MOS transistor 32, a level recognition circuit 33, and a cut off circuit 34. The P-channel MOS transistor 32 is used as a subsidiary circuit and has a source and a drain connected between the first power supply voltage Vcc and the output node Nout. The P-channel MOS transistor 32 performs the charge or discharge operation of the output node using the charge discharge circuit when turning on in response to the voltage signal S22a applied to the gate. The level recognition circuit 33 generates a control signal S33 in response to a voltage level of the output node Nout and a reference voltage Vrefc (2.4V). The cut off circuit 34 is connected to an output side of the level recognition circuit 33. The level recognition circuit 33 compares the voltage of the output node Nout and the reference voltage Vrefc. As a result, when the voltage of the output node Nout is more than the reference voltage Vrefc, the level recognition circuit 33 outputs a control signal S33 as an effective "H". The cut off circuit 34 includes a PMOS 34a, an inverter 34b, and a PMOS 34c. The PMOS 34a has a drain which receives the voltage signal S22a, a source which is connected to the gate of the PMOS 32, and a gate which receives a control signal S33. The inverter 34b inverses a logic level of the control signal S33. The PMOS 34c has a gate which receives an output signal of the inverter 34b, a source which is connected to the power supply voltage Vcc, and a drain which is connected to a gate of the PMOS 32.

Figure 5:
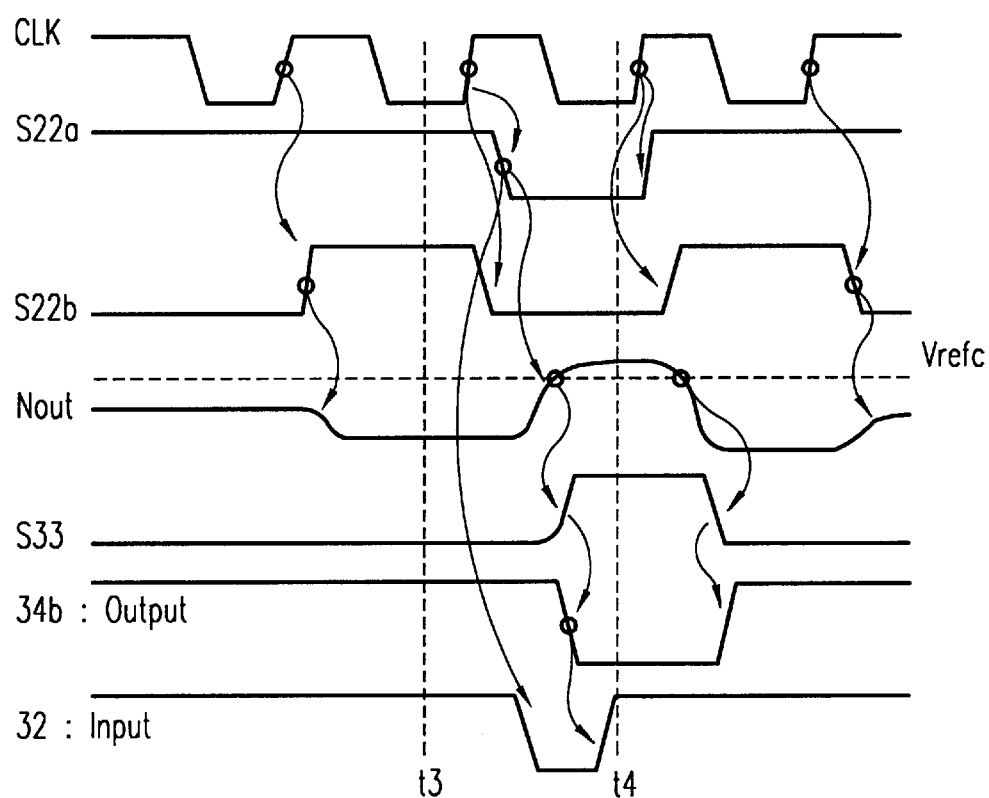
FIG. 5 is a timing chart showing an operation of the output circuit of the semiconductor memory device according to the second preferred embodiment of the present invention.

FIG. 5 is a timing chart showing an operation of the output circuit of the semiconductor memory device according to the second preferred embodiment of the present invention.

At an initial state, the voltage signal S22a is an H level, the voltage signal S22b is an L level, and the feedback signal S14 is an L level. At this time, the PMOS 31a, 32, and 34c turn off, and the PMOS 34a turns on. A clock signal CLK of the semiconductor memory device for designating an output timing rises, and as a result a voltage of the voltage signal S22a or the voltage signal S22b changes in response to the data D read out from the memory cell. For example, when the data D read out from the memory cell is "0", the voltage signal S22b changes from an L level to an H level, and as a result the NMOS 31b turns on. Therefore, the voltage of the output node Nout is the ground GND level (shown in time t1 of FIG. 5). Data "1" is read out from the memory cell synchronized with a rising of a next clock signal CLK, and as a result the NMOS 31b is turned off by the rising voltage signal S22b, and then the PMOS 31a is turned on by the falling voltage signal S22a, and a charge of the output node Nout starts. At this time, the level recognition circuit 33 compares between a voltage level of the output node Nout and the reference voltage Vrefc. In the compared result, when the voltage of the output node Nout is lower than the reference voltage Vrefc, the level recognition circuit 14 outputs the control signal S33 of an L level. As a result, the PMOS 34a turns on. Further, the PMOS 32 is applied with the voltage signal S22a of "H" via the PMOS 34a, and turns on. The PMOS 32 charges the output node Nout. A charge of the output node Nout proceeds, and then the voltage of the output node Nout becomes more than the reference voltage Vrefc, and as a result the level recognition circuit 33 outputs the control signal S33 of the effective "H". The control signal S33 changes from "L" to "H". As a result, the PMOS 34a turns off, and the PMOS 34c turns on. Accordingly, the PMOS 32 turns off since the voltage inputted to the gate is now the power supply voltage Vcc. As a result, hereafter, the charge of the output node Nout is slowly performed using only the PMOS 31a (as shown in time t4 of FIG. 5). The operations as described above are repeated, and a voltage corresponding to a logic level of the data D is successively outputted from the output node Nout.

As mentioned above, the output circuit of the second preferred embodiment includes the PMOS 32 for charging the output node Nout in addition to the PMOS 31a, which detects the voltage of the output node Nout using the level recognition circuit 33, and which turns on or off the PMOS 32 using the PMOS 34a and 34c and the inverter 34b. Accordingly, the output circuit of the second preferred embodiment can cause the output node Nout to rise at high speed. Further, the output circuit of the second preferred embodiment can fix the "H" level of the output node Nout to a stable power supply voltage Vcc.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

For example, the first preferred embodiment described the output circuit as being useful with respect to the rise of the voltage of the output node Nout, but the first preferred embodiment can also achieve an output circuit which is useful with respect to the falling of the voltage of the output node Nout by locating the level recognition circuit 14, the PMOS 12 and the NMOS 13 between the ground GND and the output node Nout. Further, the second preferred embodiment described the output circuit as being useful with respect to the rising of the voltage of the output node Nout, but the second preferred embodiment can also achieve an output circuit which is useful with respect to the falling of the voltage of the output node Nout by locating the level recognition circuit 33, the PMOS 32 and the cut off circuit 34 between the ground GND and the output node Nout. Further, the second preferred embodiment can use an NMOS instead of the PMOS 31a. In this manner, the "H" level of the output node Nout is Vcc−Vtn (Vtn: a threshold voltage of the NMOS). Further, the second preferred embodiment used one PMOS 32 as the subsidiary circuit, but it may use two or more of the PMOS 32 devices as the subsidiary circuit.

What is claimed is:

1. An output circuit comprising:
   a memory cell which stores a data;
   an amplifier which generates a voltage signal by amplifying the data read out from the memory cell;
   an output node which is connected between a first power supply voltage and a second power supply voltage;
   a first switching device which is connected between a first node and the first power supply voltage and which turns on and off in response to a feedback signal;
   a second switching device which is connected between a first reference voltage and the first node, and which complimentary turns on and off relative to the first switching device in response to the feedback signal;
   a charge discharge circuit, response to the voltage signal, which performs a charge discharge operation of the output node by connecting the first node and the output node and by connecting the second power supply voltage and the output node; and
   a level recognition circuit which outputs the feedback signal to turn on the first switching device when a voltage of the output node is less than a second reference voltage and which outputs the feedback signal to turn on the second switching device when the voltage of the output node is more than the second reference voltage.

2. An output circuit as claimed in claim 1, wherein the charge discharge circuit comprises a P-channel MOS transistor and an N-channel MOS transistor.

3. An output circuit as claimed in claim 1, wherein the first power supply voltage is a Vcc, and the second power supply voltage is a ground.

4. An output circuit as claimed in claim 1, wherein the first switching device comprise a P-channel MOS transistor.

5. An output circuit as claimed in claim 1, wherein the second switching device is an N-channel MOS transistor.

6. An output circuit as claimed in claim 1, wherein the first reference voltage has a voltage level midway between the first and second power supply voltages.

* * * * *